US009082397B2

(12) United States Patent
Laaksonen et al.

(10) Patent No.: US 9,082,397 B2
(45) Date of Patent: Jul. 14, 2015

(54) ENCODER

(75) Inventors: Lasse Laaksonen, Nokia (FI); Mikko Tammi, Tampere (FI); Adriana Vasilache, Tampere (FI); Anssi Ramo, Tampere (FI)

(73) Assignee: Nokia Technologies Oy, Espoo (FI)

( * ) Notice: Subject to any disclaimer, the term of this patent is extended or adjusted under 35 U.S.C. 154(b) by 45 days.

(21) Appl. No.: 12/741,523

(22) PCT Filed: Nov. 6, 2007

(86) PCT No.: PCT/EP2007/061917

§ 371 (c)(1), (2), (4) Date: May 5, 2010

(87) PCT Pub. No.: WO2009/059633

PCT Pub. Date: May 14, 2009

(65) Prior Publication Data

US 2010/0250261 A1 Sep. 30, 2010

(51) Int. Cl.

| | |
|---|---|
| ***G10L 19/00*** | (2013.01) |
| ***G10L 21/02*** | (2013.01) |
| ***H03G 7/00*** | (2006.01) |
| ***G10L 19/02*** | (2013.01) |
| ***G10L 21/038*** | (2013.01) |

(52) U.S. Cl.

CPC ............... *G10L 19/02* (2013.01); *G10L 21/038* (2013.01)

(58) Field of Classification Search

CPC ... G10L 19/0017; G10L 21/038; G10L 19/02; G10L 19/06

USPC ........................... 704/219, 500–504, E21.011

See application file for complete search history.

(56) References Cited

U.S. PATENT DOCUMENTS

| | | | | |
|---|---|---|---|---|
| 5,144,671 | A | 9/1992 | Mazor et al. | 704/220 |
| 5,321,793 | A | 6/1994 | Drogo De Iacovo et al. | 704/220 |
| 5,797,121 | A * | 8/1998 | Fette et al. | 704/230 |
| 5,825,320 | A | 10/1998 | Miyamori et al. | 341/139 |
| 5,970,442 | A | 10/1999 | Timner | 704/219 |
| 6,138,101 | A | 10/2000 | Fujii | 704/500 |
| 6,680,972 | B1 * | 1/2004 | Liljeryd et al. | 375/240 |
| 6,704,711 | B2 | 3/2004 | Gustfsson et al. | 704/258 |
| 7,058,571 | B2 * | 6/2006 | Tsushima et al. | 704/225 |

(Continued)

FOREIGN PATENT DOCUMENTS

| | | |
|---|---|---|
| CN | 1571993 A | 1/2005 |
| CN | 1585972 A | 2/2005 |

(Continued)

OTHER PUBLICATIONS

Yang, C-H., et al., "Design of HE-AAC Version 2 encoder", Oct. 5-8, 2006, Audio Engineering Society Convention Paper 6873, 121st Convention, 17 pages.

*Primary Examiner* — David Hudspeth
*Assistant Examiner* — Timothy Nguyen
(74) *Attorney, Agent, or Firm* — Harrington & Smith

(57) ABSTRACT

An apparatus including at least one processor and at least one memory including computer program code the at least one memory and the computer program code configured to, with the at least one processor, cause the apparatus at least to select at least two single frequency components; generate an indicator, the indicator being configured to represent the at least two single frequency components and is configured to be dependent on the frequency separation between the two single frequency components.

11 Claims, 9 Drawing Sheets

(56) References Cited

U.S. PATENT DOCUMENTS

| | | | | |
|---|---|---|---|---|
| 7,328,162 | B2 * | 2/2008 | Liljeryd et al. | 704/503 |
| 7,343,287 | B2 * | 3/2008 | Geiger et al. | 704/230 |
| 7,469,206 | B2 * | 12/2008 | Kjorling et al. | 704/205 |
| 7,548,853 | B2 * | 6/2009 | Shmunk et al. | 704/219 |
| 7,562,021 | B2 * | 7/2009 | Mehrotra et al. | 704/500 |
| 7,831,434 | B2 * | 11/2010 | Mehrotra et al. | 704/500 |
| 2002/0094100 | A1 | 7/2002 | Kates et al. | 381/318 |
| 2002/0169603 | A1 | 11/2002 | Sculley | 704/229 |
| 2003/0187663 | A1 | 10/2003 | Truman et al. | 704/500 |
| 2004/0078194 | A1 | 4/2004 | Liljeryd et al. | 704/200.1 |
| 2005/0065783 | A1 | 3/2005 | Ojala et al. | 341/139 |
| 2005/0080621 | A1 * | 4/2005 | Tsushima et al. | 704/229 |
| 2005/0096917 | A1 * | 5/2005 | Kjorling et al. | 704/500 |
| 2005/0254588 | A1 | 11/2005 | Kim et al. | 375/260 |
| 2006/0158356 | A1 | 7/2006 | Kim et al. | 341/51 |
| 2006/0184363 | A1 | 8/2006 | McCree et al. | 704/233 |
| 2007/0016411 | A1 * | 1/2007 | Kim et al. | 704/226 |
| 2007/0016412 | A1 | 1/2007 | Mehrotra et al. | 704/229 |
| 2007/0088542 | A1 | 4/2007 | Vos et al. | 704/219 |
| 2007/0156397 | A1 * | 7/2007 | Chong et al. | 704/229 |
| 2008/0262835 | A1 * | 10/2008 | Oshikiri | 704/205 |
| 2009/0187409 | A1 * | 7/2009 | Krishnan et al. | 704/262 |
| 2009/0271204 | A1 * | 10/2009 | Tammi | 704/500 |
| 2010/0017197 | A1 * | 1/2010 | Oshikiri | 704/205 |
| 2010/0030563 | A1 * | 2/2010 | Uhle et al. | 704/500 |
| 2010/0250261 | A1 * | 9/2010 | Laaksonen et al. | 704/500 |
| 2010/0280830 | A1 * | 11/2010 | Vasilache et al. | 704/500 |
| 2010/0292994 | A1 | 11/2010 | Lee et al. | 704/500 |
| 2011/0099004 | A1 * | 4/2011 | Krishnan et al. | 704/206 |
| 2011/0184731 | A1 * | 7/2011 | Kim | 704/205 |
| 2011/0270614 | A1 * | 11/2011 | Liu et al. | 704/262 |

FOREIGN PATENT DOCUMENTS

| | | | |
|---|---|---|---|
| WO | WO 2005/008628 | A1 | 1/2005 |
| WO | WO 2006/116025 | A1 | 11/2006 |
| WO | WO-2007/011115 | A1 | 1/2007 |
| WO | WO 2007/052088 | A1 | 5/2007 |

* cited by examiner

ENCODER

FIELD OF THE INVENTION

The present invention relates to coding, and in particular, but not exclusively to speech or audio coding.

BACKGROUND OF THE INVENTION

Audio signals, like speech or music, are encoded for example for enabling an efficient transmission or storage of the audio signals.

Audio encoders and decoders are used to represent audio based signals, such as music and background noise. These types of coders typically do not utilise a speech model for the coding process, rather they use processes for representing all types of audio signals, including speech.

Speech encoders and decoders (codecs) are usually optimised for speech signals, and can operate at either a fixed or variable bit rate.

An audio codec can also be configured to operate with varying bit rates. At lower bit rates, such an audio codec may work with speech signals at a coding rate equivalent to a pure speech codec. At higher bit rates, the audio codec may code any signal including music, background noise and speech, with higher quality and performance.

In some audio codecs the input signal is divided into a limited number of bands. Each of the band signals may be quantized. From the theory of psychoacoustics it is known that the highest frequencies in the spectrum are perceptually less important than the low frequencies. This in some audio codecs is reflected by a bit allocation where fewer bits are allocated to high frequency signals than low frequency signals.

Furthermore in some codecs use the correlation between the low and high frequency bands or regions of an audio signal to improve the coding efficiency with the codecs.

As typically the higher frequency bands of the spectrum are generally quite similar to the lower frequency bands some codecs may encode only the lower frequency bands and reproduce the upper frequency bands as a scaled lower frequency band copy. Thus by only using a small amount of additional control information considerable savings can be achieved in the total bit rate of the codec.

One such codec for coding the high frequency region is known as higher frequency region (HFR) coding. One form of higher frequency region coding is spectral-band-replication (SBR), which has been developed by Coding Technologies. In SBR, a known audio coder, such as Moving Pictures Expert Group MPEG-4 Advanced Audio Coding (AAC) or MPEG-1 Layer III (MP3) coder, codes the low frequency region. The higher frequency region is generated separately utilizing the coded low frequency region.

In SBR coding, the higher frequency region is obtained by transposing the lower frequency region to the higher frequencies. The transposition is based on a Quadrature Mirror Filters (QMF) filter bank with 32 bands and is performed such that it is predefined from which band samples each high frequency band sample is constructed. This is done independently of the characteristics of the input signal.

The higher frequency bands are modified based on additional information. The filtering is done to make particular features of the synthesized high frequency region more similar with the original one. Additional components, such as sinusoids or noise, are added to the high frequency region to increase the similarity with the original high frequency region. Finally, the envelope is adjusted to follow the envelope of the original high frequency spectrum.

Higher frequency region coding however does not produce an identical copy of the original high frequency region. Specifically, the known higher frequency region coding mechanisms perform relatively poorly where the input signal is tonal, in other words does not have a spectrum similar to that of noise.

SUMMARY OF THE INVENTION

This invention proceeds from the consideration that the currently proposed codecs lack flexibility with respect to being able to code efficient and accurate approximations to the signals.

Embodiments of the present invention aim to address the above problem.

There is provided according to a first aspect of the invention an encoder for encoding an audio signal, wherein the encoder is configured to: define a set of single frequency components; select at least one single frequency component from a first sub-set of the set of single frequency components.

The encoder may be further configured to generate at least one first indicator to represent the at least one selected single frequency component.

The encoder may be further configured to select at least one further single frequency component from at least a second sub-set of the set of single frequency components.

The encoder may be further configured to generate at least one second indicator to represent the at least one selected further single frequency component.

The encoder may be further configured to divide the set of single frequency components into at least a first and a second sub-sets of single frequency components.

The encoder may be further configured to divide the set of single frequency components into at least the first and second sub-sets of single frequency components dependent on the frequency of the single frequency component within the set.

The encoder may be further configured to divide the set of single frequency components into at least the first and second sub-sets of single frequency components dependent on the perceptual importance of the single frequency component within the set.

The single frequency components are preferably sinusoids.

According to a second aspect of the invention there is provided a method for encoding an audio signal, comprising: defining a set of single frequency components; selecting at least one single frequency component from a first sub-set of the set of single frequency components.

The method may further comprise generating at least one first indicator to represent the at least one selected single frequency component.

The method may further comprise selecting at least one further single frequency component from at least a second sub-set of the set of single frequency components The method may further comprise generating at least one second indicator to represent the at least one selected further single frequency component.

The method may further comprise dividing the set of single frequency components into at least a first and a second sub-sets of single frequency components.

Dividing the set of single frequency components into at least a first and a second sub-sets of single frequency components may be dependent on the frequency of the single frequency component within the set.

Dividing the set of single frequency components into at least a first and a second sub-sets of single frequency components may be further dependent on the perceptual importance of the single frequency component within the set.

The single frequency components may be sinusoids.

According to a third aspect of the invention there is provided a decoder for decoding an audio signal, wherein the decoder is configured to: receive at least one indicator representing at least one single frequency component from a first sub-set of a set of single frequency components; and insert the single frequency component dependent on the indicator received.

The decoder may be further configured to receive at least one further indicator representing at least one further single frequency component from at least one further sub-set of the set of single frequency components; and insert the further single frequency component dependent on the further indicator received.

The decoder may be further configured to receive a sign indicator representing the sign of the at least one single frequency component from a first sub-set of a set of single frequency components.

According to a fourth aspect of the present invention there is provided a method for decoding an audio signal, comprising: receiving at least one indicator representing at least one single frequency component from a first sub-set of a set of single frequency components; and inserting the at least one single frequency component dependent on the indicator received.

The method may further comprise: receiving at least one further indicator representing at least one further single frequency component from at least one further sub-set of the set of single frequency components; and inserting the at least one further single frequency component dependent on the further indicator received.

The method may further comprise receiving a sign indicator representing the sign of the at least one single frequency component from a first sub-set of a set of single frequency components.

According to a fifth aspect of the invention there is provided an apparatus comprising an encoder as detailed above.

According to a sixth aspect of the invention there is provided an apparatus comprising a decoder as detailed above.

According to a seventh aspect of the invention there is provided an electronic device comprising an encoder as detailed above.

According to an eighth aspect of the invention there is provided an electronic device comprising a decoder as detailed above.

According to a ninth aspect of the invention there is provided a computer program product configured to perform a method for encoding an audio signal, comprising: defining a set of single frequency components; selecting at least one single frequency component from a first sub-set of the set of single frequency components.

According to a tenth aspect of the invention there is provided a computer program product configured to perform a method for decoding an audio signal, comprising: receiving at least one indicator representing at least one single frequency component from a first sub-set of a set of single frequency components; and inserting the at least one single frequency component dependent on the indicator received.

According to an eleventh aspect of the invention an encoder for encoding an audio signal comprising: means to define a set of single frequency components; selection means to select at least one single frequency component from a first sub-set of the set of single frequency components.

According to a twelfth aspect of the invention there is provided a decoder for decoding an audio signal, comprising: receiving means for receiving at least one indicator representing at least one single frequency component from a first sub-set of a set of single frequency components; and insertion means for inserting the single frequency component dependent on the indicator received.

According to a thirteenth aspect of the invention there is provided an encoder for encoding an audio signal, wherein the encoder is configured to: select at least two single frequency components; generate an indicator, the indicator being configured to represent the at least two single frequency components and is configured to be dependent on the frequency separation between the two single frequency components.

The encoder may be further configured to select at least one further single frequency component; wherein the indicator is preferably further configured to represent the at least one further single frequency component and wherein the indicator is further preferably configured to be dependent on the frequency separation between the at least one further single frequency component and one of the at least two single frequency components.

The indicator is preferably further configured to be dependent on the frequency of one of the at least two single frequency components.

The encoder may be further configured to determine the frequency separation between the two single frequency components.

The encoder may be further configured to: search a list of frequency separation values for the determined frequency separation between the two single frequency components; and select one of the list which more closely matches the determined frequency separation between the two single frequency components, wherein the indicator is dependent on selected one of the list of frequency separation values.

The encoder may be further configured to: determine a difference between the selected one of the list of frequency separation values and the determined frequency separation value; wherein the indicator is preferably further dependent on the difference.

The encoder may be further configured to: search a further list of difference values for the determined difference between the selected one of the list of frequency separation values and the determined frequency separation value; and select one of the further list of difference values which more closely matches the determined difference value, wherein the indicator is preferably dependent on selected one of the further list of difference values.

According to a fourteenth aspect of the invention there is provided a method for encoding an audio signal, comprising: selecting at least two single frequency components; generating an indicator, the indicator being configured to represent the at least two single frequency components and is configured to be dependent on the frequency separation between the two single frequency components.

The method may further comprise selecting at least one further single frequency component; wherein the indicator is preferably further configured to represent the at least one further single frequency component and wherein the indicator is further preferably configured to be dependent on the frequency separation between the at least one further single frequency component and one of the at least two single frequency components.

The indicator may be further dependent on the frequency of one of the at least two single frequency components The method may further comprise determining the frequency separation between the two single frequency components.

The method may further comprise: searching a list of frequency separation values for the determined frequency separation between the two single frequency components; and selecting one of the list which more closely matches the determined frequency separation between the two single frequency components, wherein the indicator is preferably dependent on the selected one of the list of frequency separation values.

The method may further comprise determining a difference between the selected one of the list of frequency separation values and the determined frequency separation value; wherein the indicator is preferably further dependent on the difference.

The method may further comprise: searching a further list of difference values for the determined difference between the selected one of the list of frequency separation values and the determined frequency separation value; and selecting one of the further list of difference values which more closely matches the determined difference value, wherein the indicator is preferably dependent on selected one of the further list of difference values.

According to a fifteenth aspect of the invention there is provided a decoder for decoding an audio signal, wherein the decoder is configured to: receive at least one indicator representing at least two single frequency components, wherein the indicator represents the frequency separation between the two single frequency components; and insert the at least two single frequency components dependent on the indicator received.

The at least one indicator is preferably further configured to represent an at least one further single frequency component, the indicator is preferably further configured to be dependent on the frequency separation between the at least one further single frequency component and one of the at least two single frequency components; and the decoder is preferably further configured to insert the at least one further single frequency component dependent on the indicator.

According to a sixteenth aspect of the present invention there is provided a method for decoding an audio signal, comprising: receiving at least one indicator representing at least two single frequency components, wherein the indicator represents the frequency separation between the two single frequency components; and inserting the at least two single frequency components dependent on the indicator received.

The at least one indicator is preferably further configured to represent an at least one further single frequency component, the indicator is preferably further configured to be dependent on the frequency separation between the at least one further single frequency component and one of the at least two single frequency components; and the method may further comprise inserting the at least one further single frequency component dependent on the indicator.

According to a seventeenth aspect of the invention there is provided an apparatus comprising an encoder as detailed above.

According to an eighteenth aspect of the invention there is provided an apparatus comprising a decoder as detailed above.

According to a nineteenth aspect of the invention there is provided an electronic device comprising an encoder as detailed above.

According to a twentieth aspect of the invention there is provided an electronic device comprising a decoder as detailed above.

According to a twenty-first aspect of the invention there is provided a computer program product configured to perform a method for encoding an audio signal, comprising: selecting at least two single frequency components; generating an indicator, the indicator being configured to represent the at least two single frequency components and is configured to be dependent on the frequency separation between the two single frequency components.

According to a twenty-second aspect of the invention there is provided a computer program product configured to perform a method for decoding an audio signal, comprising: receiving at least one indicator representing at least two single frequency components, wherein the indicator represents the frequency separation between the two single frequency components; and inserting the at least two single frequency components dependent on the indicator received.

According to a twenty-third aspect of the invention there is provided an encoder for encoding an audio signal comprising: selection means for selecting at least two single frequency components; indication generation means for generating an indicator, the indicator being configured to represent the at least two single frequency components and is configured to be dependent on the frequency separation between the two single frequency components.

According to a twenty-fourth aspect of the invention there is provided a decoder for decoding an audio signal, comprising: receiving means for receiving at least one indicator representing at least two single frequency components, wherein the indicator represents the frequency separation between the two single frequency components; and insertion means for inserting the at least two single frequency components dependent on the indicator received.

BRIEF DESCRIPTION OF DRAWINGS

For better understanding of the present invention, reference will now be made by way of example to the accompanying drawings in which.

DESCRIPTION OF PREFERRED EMBODIMENTS OF THE INVENTION

Figure 1:
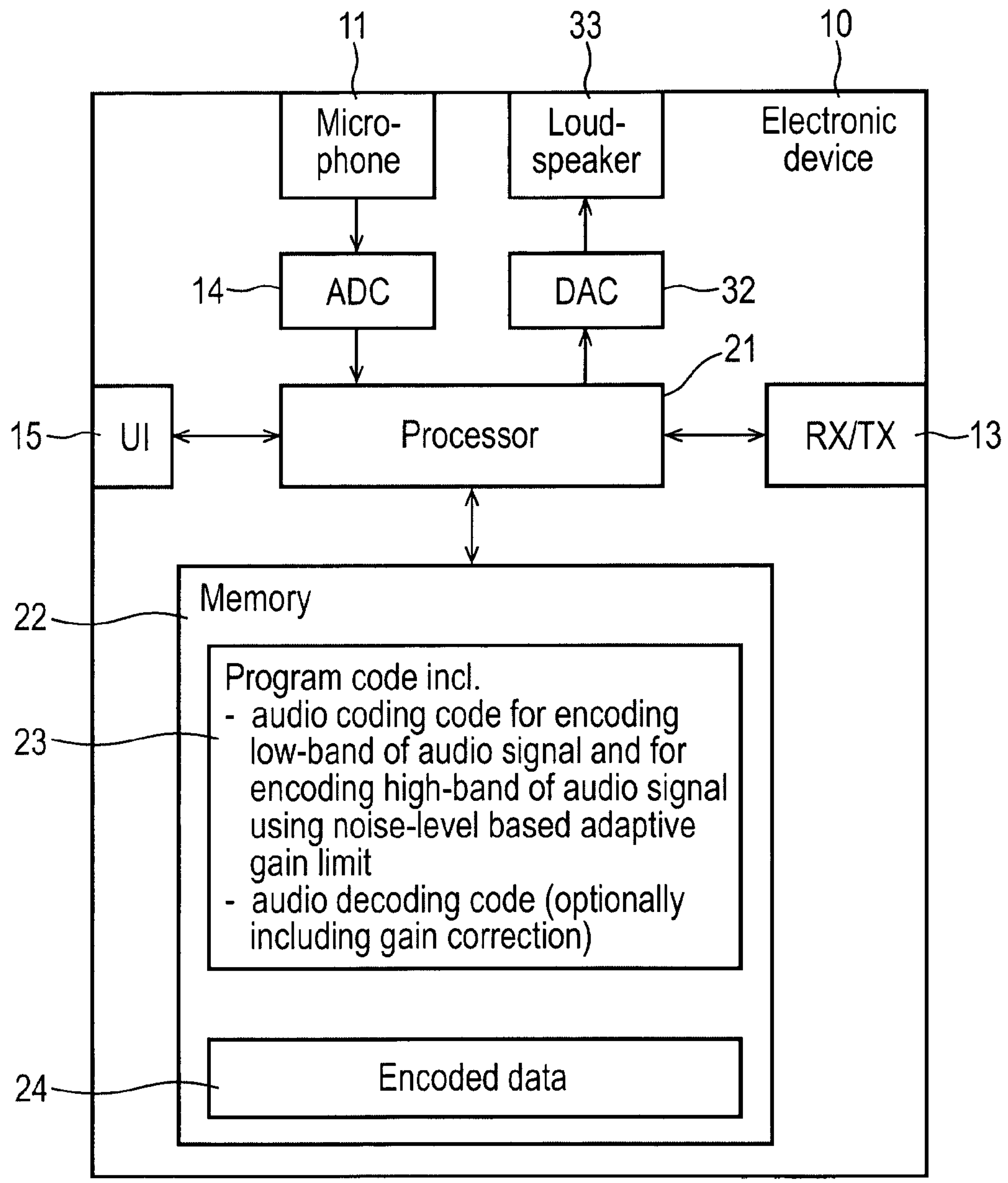
FIG. 1 shows schematically an electronic device employing embodiments of the invention.

The following describes in more detail possible codec mechanisms for the provision of layered or scalable variable rate audio codecs. In this regard reference is first made to FIG. 1 which shows a schematic block diagram of an exemplary electronic device 10, which may incorporate a codec according to an embodiment of the invention.

The electronic device 10 may for example be a mobile terminal or user equipment of a wireless communication system.

The electronic device 10 comprises a microphone 11, which is linked via an analogue-to-digital converter (ADC) 14 to a processor 21. The processor 21 is further linked via a digital-to-analogue (DAC) converter 32 to loudspeakers 33.

The processor 21 is further linked to a transceiver (MTX) 13, to a user interface (UI) 15 and to a memory 22.

The processor 21 may be configured to execute various program codes. The implemented program codes comprise an audio encoding code for encoding a lower frequency band of an audio signal and a higher frequency band of an audio signal. The implemented program codes 23 further comprise an audio decoding code. The implemented program codes 23 may be stored for example in the memory 22 for retrieval by the processor 21 whenever needed. The memory 22 could further provide a section 24 for storing data, for example data that has been encoded in accordance with the invention.

The encoding and decoding code may in embodiments of the invention be implemented in hardware or firmware.

The user interface 15 enables a user to input commands to the electronic device 10, for example via a keypad, and/or to obtain information from the electronic device 10, for example via a display. The transceiver 13 enables a communication with other electronic devices, for example via a wireless communication network.

It is to be understood again that the structure of the electronic device 10 could be supplemented and varied in many ways.

A user of the electronic device 10 may use the microphone 11 for inputting speech that is to be transmitted to some other electronic device or that is to be stored in the data section 24 of the memory 22. A corresponding application has been activated to this end by the user via the user interface 15. This application, which may be run by the processor 21, causes the processor 21 to execute the encoding code stored in the memory 22.

The analogue-to-digital converter 14 converts the input analogue audio signal into a digital audio signal and provides the digital audio signal to the processor 21.

The processor 21 may then process the digital audio signal in the same way as described with reference to FIGS. 2 and 3.

The resulting bit stream is provided to the transceiver 13 for transmission to another electronic device. Alternatively, the coded data could be stored in the data section 24 of the memory 22, for instance for a later transmission or for a later presentation by the same electronic device 10.

The electronic device 10 could also receive a bit stream with correspondingly encoded data from another electronic device via its transceiver 13. In this case, the processor 21 may execute the decoding program code stored in the memory 22. The processor 21 decodes the received data, and provides the decoded data to the digital-to-analogue converter 32. The digital-to-analogue converter 32 converts the digital decoded data into analogue audio data and outputs them via the loudspeakers 33. Execution of the decoding program code could be triggered as well by an application that has been called by the user via the user interface 15.

The received encoded data could also be stored instead of an immediate presentation via the loudspeakers 33 in the data section 24 of the memory 22, for instance for enabling a later presentation or a forwarding to still another electronic device.

Figure 2:
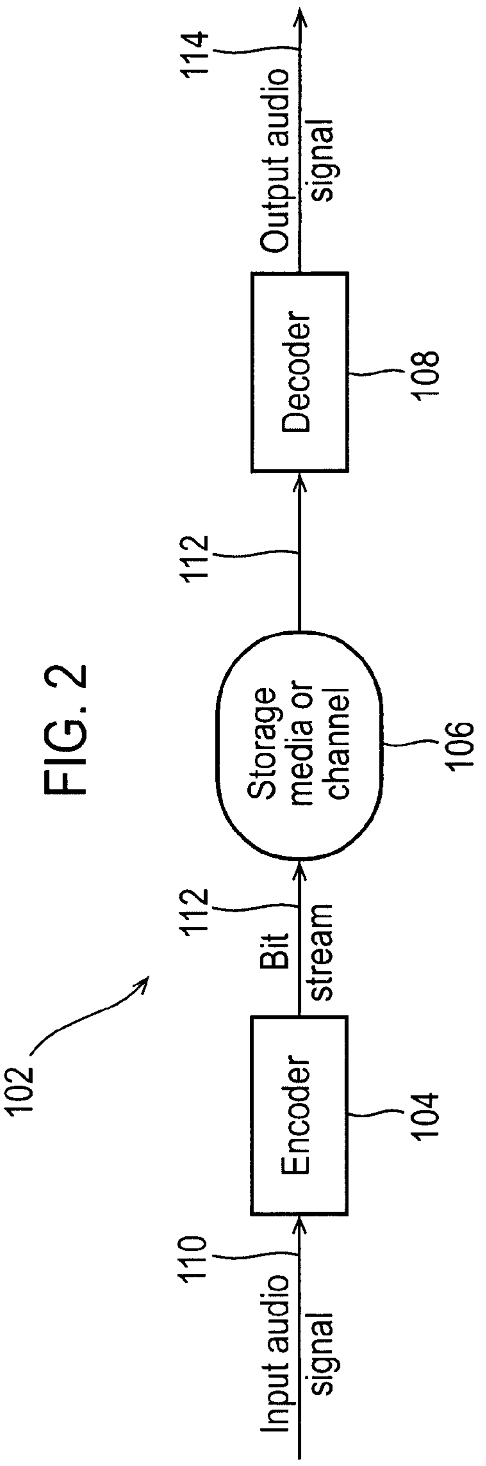
FIG. 2 shows schematically an audio codec system employing embodiments of the present invention.
Figure 3:
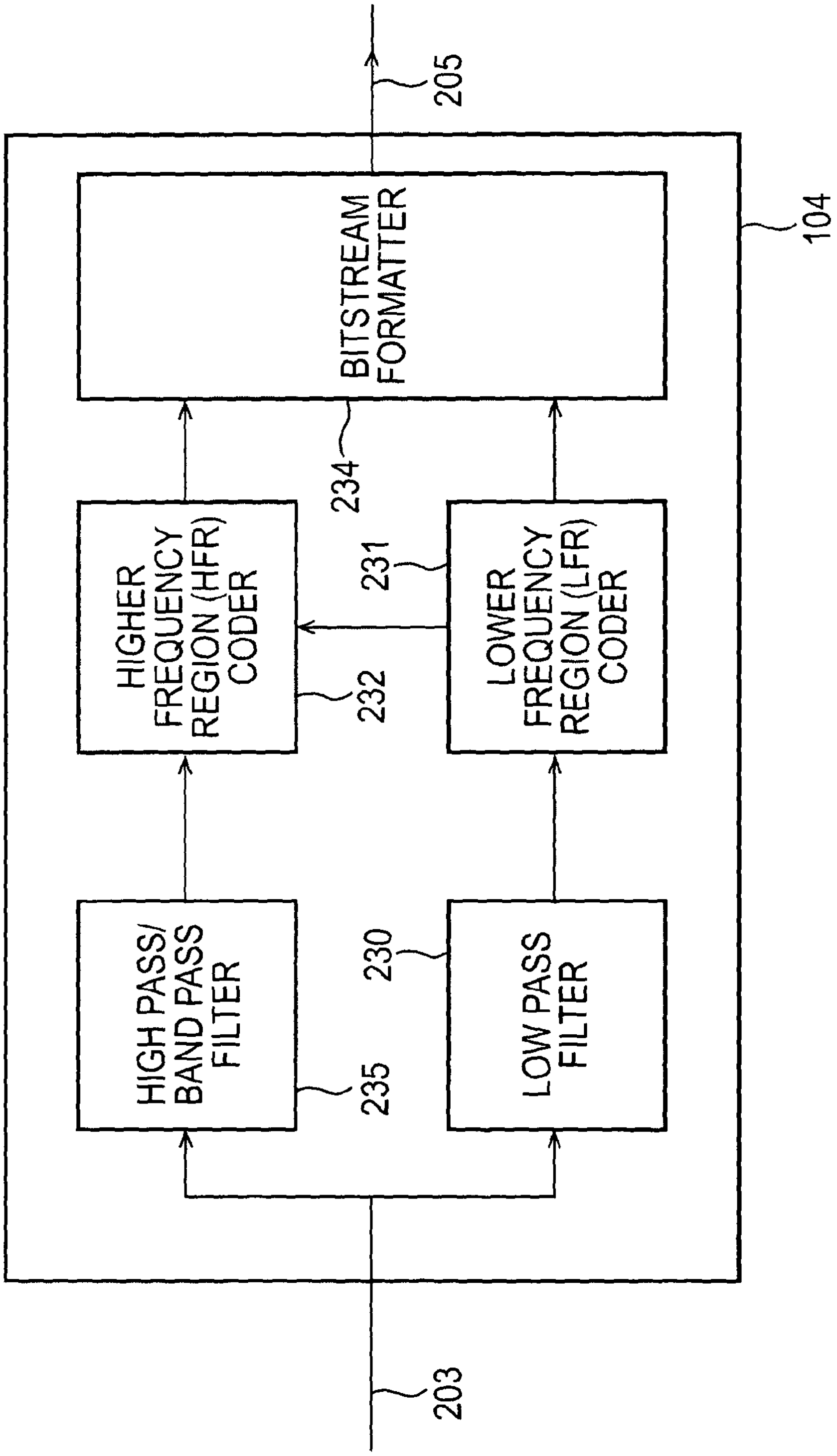
FIG. 3 shows schematically an encoder part of the audio codec system shown in FIG. 2.
Figure 4:
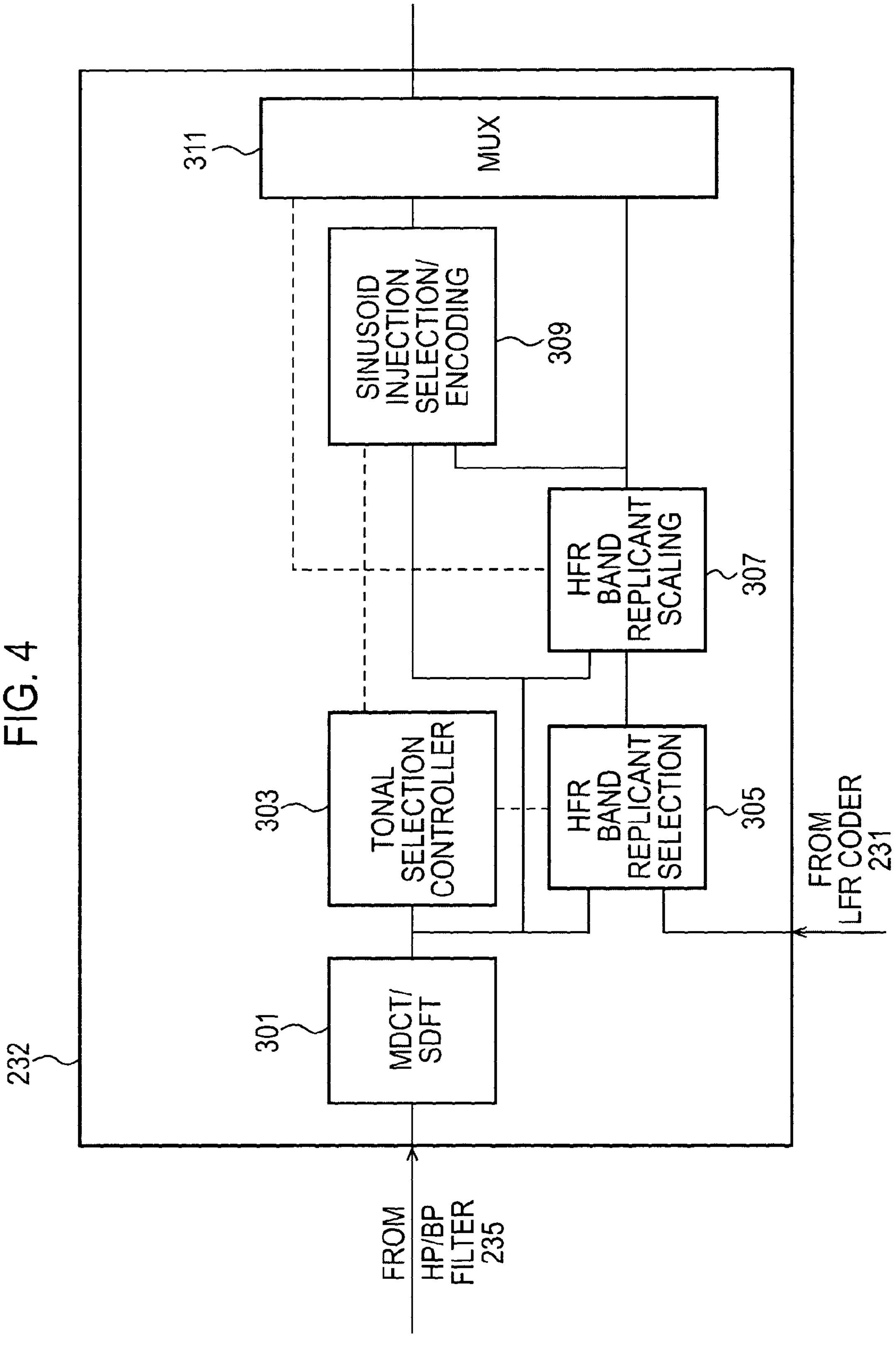
FIG. 4 shows a schematic view of the higher frequency region encoder portion of the encoder as shown in FIG. 3.
Figure 7:
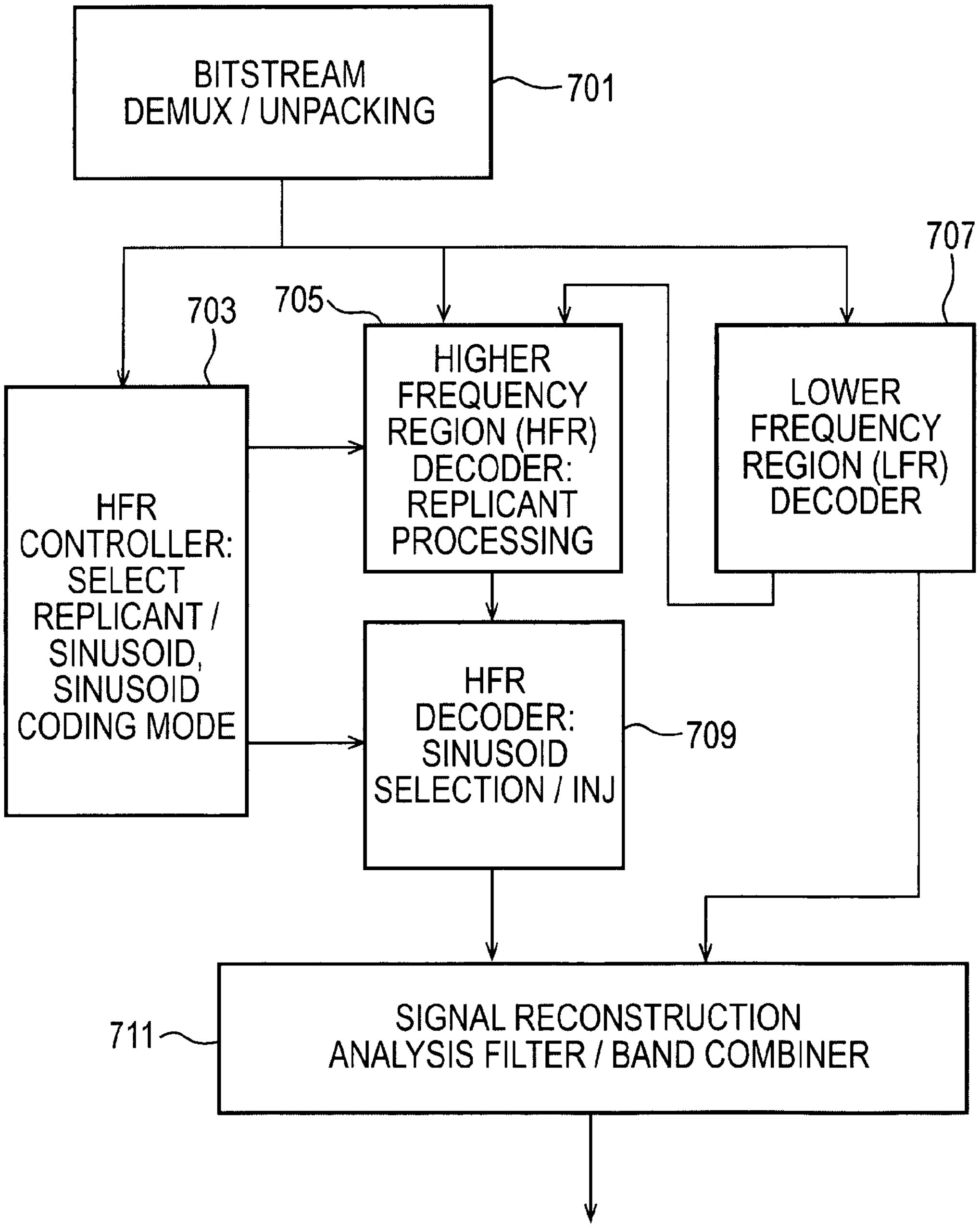
FIG. 7 shows a flow diagram illustrating the operation of an embodiment of the audio decoder as shown in FIG. 5 according to the present invention.
Figure 8:
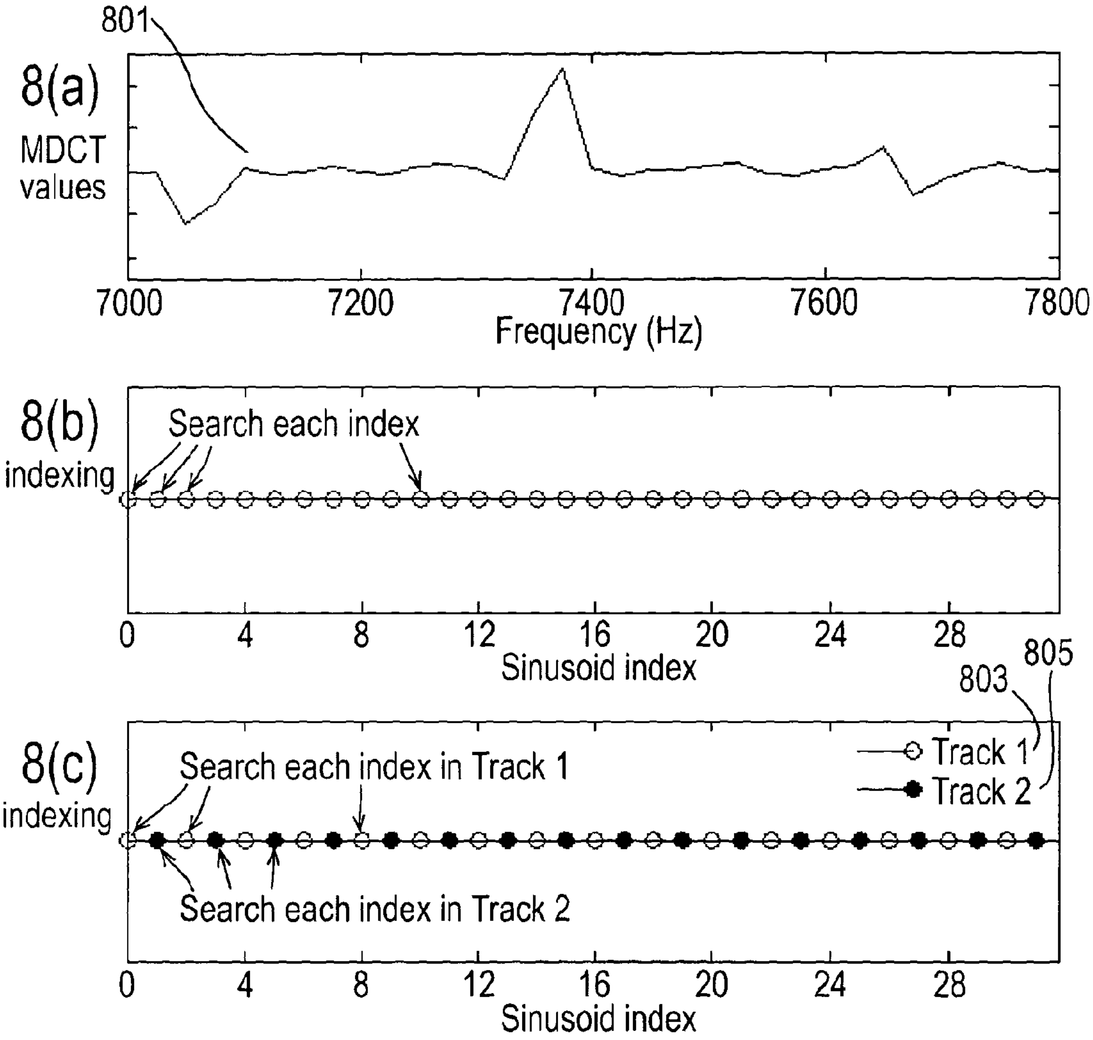
FIG. 8 shows examples of a spectral representation of an audio signal, inserted sinusoidal positions, and encoding of the sinusoidal positions according to embodiments of the invention.

It would be appreciated that the schematic structures described in FIGS. 2 to 4 and the method steps in FIGS. 7 and 8 represent only a part of the operation of a complete audio codec as exemplarily shown implemented in the electronic device shown in FIG. 1.

The general operation of audio codecs as employed by embodiments of the invention is shown in FIG. 2. General audio coding/decoding systems consist of an encoder and a decoder, as illustrated schematically in FIG. 2. Illustrated is a system 102 with an encoder 104, a storage or media channel 106 and a decoder 108.

The encoder 104 compresses an input audio signal 110 producing a bit stream 112, which is either stored or transmitted through a media channel 106. The bit stream 112 can be received within the decoder 108. The decoder 108 decompresses the bit stream 112 and produces an output audio signal 114. The bit rate of the bit stream 112 and the quality of the output audio signal 114 in relation to the input signal 110 are the main features which define the performance of the coding system 102.

FIG. 3 shows schematically an encoder 104 according to an embodiment of the invention. The encoder 104 comprises an input 203 arranged to receive an audio signal. The input 203 is connected to a low pass filter 230 and high pass/band pass filter 235. The low pass filter 230 furthermore outputs a signal to the lower frequency region (LFR) coder (otherwise known as the core codec) 231. The lower frequency region coder 231 is configured to output signals to the higher frequency region (HFR) coder 232. The high pass/band pass filter 235 is connected to the HFR coder 232. The LFR coder 231, and the HFR coder 232 are configured to output signals to the bitstream formatter 234 (which in some embodiments of the invention is also known as the bitstream multiplexer). The bitstream formatter 234 is configured to output the output bitstream 112 via the output 205.

In some embodiments of the invention the high pass/band pass filter 235 may be optional, and the audio signal passed directly to the HFR coder 232.

Figure 6:
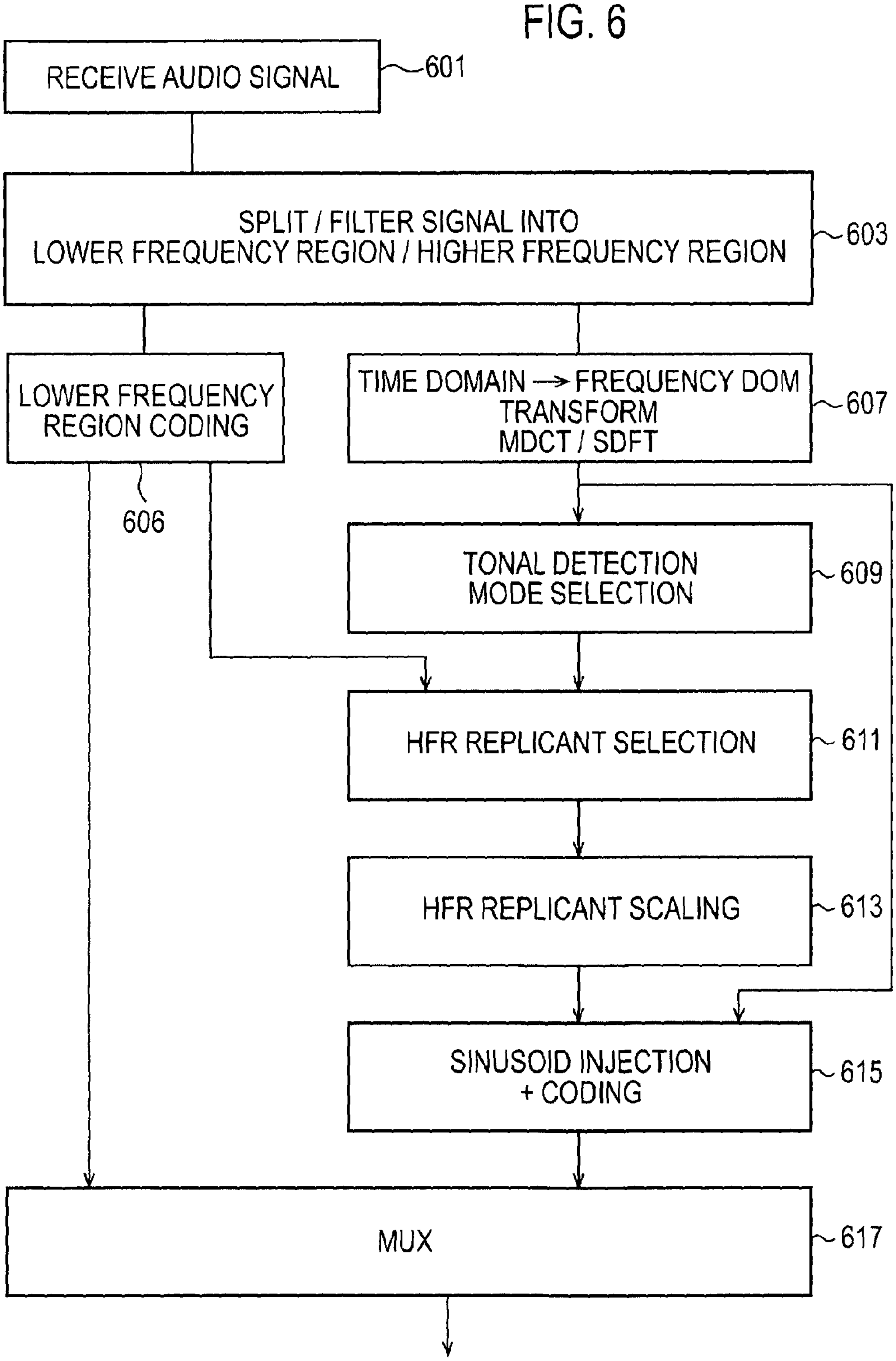
FIG. 6 shows a flow diagram illustrating the operation of an embodiment of the audio encoder as shown in FIGS. 3 and 4 according to the present invention.

The operation of these components is described in more detail with reference to the flow chart, FIG. 6, showing the operation of the coder 104.

The audio signal is received by the coder 104. In a first embodiment of the invention the audio signal is a digitally sampled signal. In other embodiments of the present invention the audio input may be an analogue audio signal, for example from a microphone 6, which is analogue to digitally (A/D) converted. In further embodiments of the invention the audio input is converted from a pulse code modulation digital signal to amplitude modulation digital signal. The receiving of the audio signal is shown in FIG. 7 by step 601.

The low pass filter 230 and the high pass/band pass filter 235 receive the audio signal and define a cut-off frequency up to which the input signal 110 is filtered. The received audio signal frequencies below the cut-off frequency are passed by the low pass filter 230 to the lower frequency region (LFR) coder 231. The received audio signal frequencies above the cut-off frequency are passed by the high pass filter 235 to the higher frequency region (HFR) coder 232. In some embodiments of the invention the signal is optionally down sampled in order to further improve the coding efficiency of the lower frequency region coder 231.

The LFR coder 231 receives the low frequency (and optionally down sampled) audio signal and applies a suitable low frequency coding upon the signal. In a first embodiment of the invention the low frequency coder 231 applies a quantization and Huffman coding with 32 low frequency sub-bands. The input signal 110 is divided into sub-bands using an analysis filter bank structure. Each sub-band may be quantized and coded utilizing the information provided by a psychoacoustic model. The quantization settings as well as the coding scheme may be dictated by the psychoacoustic model applied. The quantized, coded information is sent to the bit stream formatter 234 for creating a bit stream 112.

Furthermore the LFR coder 231 converts the low frequency content using a modified discrete cosine transform (MDCT) to produce frequency domain realizations of synthetic LFR signal. These frequency domain realizations are passed to the HFR coder 232.

This lower frequency region coding is shown in FIG. 6 by step 606.

In other embodiments of the invention other low frequency codecs may be employed in order to generate the core coding output which is output to the bitstream formatter 234. Examples of these further embodiment low frequency codecs include but are not limited to advanced audio coding (AAC), MPEG layer 3 (MP3), the ITU-T Embedded variable rate (EV-VBR) speech coding baseline codec, and ITU-T G.729.1.

Where the lower frequency region coder 231 does not effectively output a frequency domain synthetic output as part of the coding process the low frequency region (LFR) coder 231 may furthermore comprise a low frequency decoder and frequency domain converter (not shown in FIG. 3) to generate a synthetic reproduction of the low frequency signal and the synthetic reproduction of the low frequency signal. These may then in embodiments of the invention be converted into frequency domain representations and, if needed, partitioned into a series of low frequency sub-bands which are sent to the HFR coder 232.

This allows in embodiments of the invention the choice of the lower frequency region coder 231 to be made from a wide range of possible coder/decoders and as such the invention is not limited to a specific low frequency or core code algorithm which produces frequency domain information as part of the output.

The higher frequency region (HFR) coder 232 is schematically shown in further detail in FIG. 4.

The higher frequency region coder 232 receives the signal from the high pass/band pass filter 235 which is input to a modified discrete cosine transform (MDCT)/shifted discrete Fourier transform (SDFT) processor 301.

The frequency domain output from the MDCT/SDFT transformer 301 is passed to the tonal selection controller 303, the higher frequency region (HFR) band replicant selection processor 305, the higher frequency region band replicant scaling processor 307, and the sinusoid injection selection/encoding processor 309.

The tonal selection controller 303 is configured to control or configure the HFR band replicant selection processor 305, the HFR band replicant scaling processor 307, the sinusoid injection selection/encoding processor 309, and the multiplexer 311. The HFR band replicant selection processor 305 furthermore receives from the LFR coder 231 the synthesised lower frequency region signal in frequency domain form. The HFR band replicant selection processor 305 outputs selected HFR bands from the LFR coder as will be described hereafter and passes the selection to the HFR band replicant scaling processor 307.

The HFR band replicant scaling processor 305 transmits an encoded form of the selection and scaling elements to the multiplexer 311 to be inserted in the data stream 112. Furthermore, the HFR band replicant scaling processor 307 furthermore passes a representation of the selected and scaled HFR region to the sinusoid injection selection/encoding processor 309. The sinusoid injection selection/encoding processor 309 furthermore passes a signal to the multiplexer 311 for inclusion in the output data stream 112.

We will now explain in detail with reference to FIG. 6 and FIG. 4, how the HFR encoder operates.

The MDCT/SDFT processor 301 converts the high frequency region audio signal received from the HP/BP filter 235 into a frequency domain representation of the signal.

In some embodiments of the invention the MDCT/SDFT processor furthermore divides the higher frequency audio signal into short frequency sub-bands. These frequency sub-bands may be of the order of 500-800 Hz wide. In some embodiments of the invention the frequency sub-bands have non-equal band-widths. In a further embodiment the frequency sub-bands have a bandwidth of 750 Hz. In other embodiments of the invention, the bandwidth of the frequency sub-bands, either non-equal or equal, may be dependent on the bandwidth allocation for the high frequency region.

In a first embodiment of the invention, the frequency sub-band bandwidth is constant, in other words does not change from frame to frame. In other embodiments of the invention, the frequency sub-band bandwidth is not constant and a frequency sub-band may have bandwidth which changes over time.

In some embodiments of the invention, this variable frequency sub-band bandwidth allocation may be determined based on a psycho-acoustic modelling of the audio signal. These frequency sub-bands may furthermore be in various embodiments of the invention successive (in other words, one after another and producing a continuous spectral realisation) or partially overlapping.

The time domain to frequency domain transformation and sub-band organisation step is shown in FIG. 6 by step 607.

The tonal selection controller 303 may be configured to control the HFR band replicant selection, scaling, the sinusoid injection selection and encoding and the multiplexer in order that a more efficient encoding of the higher frequency region can be carried out.

The shifted discrete fourier transform output from the MDCT/SDFT processor 301 is received at the tonal selection controller 303.

An example of a shifted discrete Fourier transform (SDFT) defined for two N samples (which may be considered to be a frame for preferred embodiments of the invention) is shown by Equation 1:

$$Y(k) = \sum_{n=0}^{2N-1} h(n)x(n)\exp(i2\pi(n+u)(k+v)/2N) \quad (1)$$

where h(n) is the scaling window, x(n) is the original input signal, and u and v represent the time and frequency domain shifts respectively.

In one embodiment of the invention u and v may be selected to be u=(N+1)/2 and v=½, since the real part of the selected SDFT transform may also be used as the MDCT transform. This therefore enables the MDCT transformer and the SDFT transformer to be implemented within a single time to frequency domain operation and therefore reduces the complexity of the device.

The tonal selection controller 303 may be configured to detect whether the input higher frequency region signal is normal or tonal. The tonal selection controller 303 may determine the characteristic of the signal by comparing the SDFT output for a current and previous frame.

For example if the current and previous SDFT frames are defined as $Y_b(k)$ and $Y_{b-1}(k)$ respectively, the similarity between the frames may be measured by the index S. S is defined in equation 2.

$$S = \frac{\sum_{k=N_L+1}^{N} (|Y_b(k)| - |Y_{b-1}(k)|)^2}{\sum_{k=N_L+1}^{N} (|Y_b(k)|)^2} \quad 2$$

where $N_L+1$ corresponds to the limit frequency for high frequency coding. The smaller the parameter S, the more similar the high frequency spectrums are.

The tonal selection controller may comprise decision logic which assigns a signal characteristic or mode dependent on the value of S. Furthermore the characteristic or mode of the signal furthermore is used to control the remainder of the HFR coder as is described in further detail below.

The following shows an embodiment of the invention where two characteristics or modes of the audio signal are defined. These characteristics or modes are normal and tonal.

The decision logic within the tonal selection controller 303 may be configured to assign the characteristic of normal (which may indicate to the remainder of the HFR coder that normal coding is to be used possibly together with some sinusoid insertion) if the value of S is greater than or equal to a predetermined threshold value $S_{lim}$.

The decision logic within the tonal selection controller 303 may further be configured to assign the characteristic of tonal (which may indicate to the remainder of the HFR coder that the audio signal can be coded using sinusoid insertion only) if the value of S is less than the predetermined threshold $S_{lim}$. More sinusoids may be added in this mode as no bits are used for quantising the parameters of normal coding mode.

Although, two modes of operation have been described it would be understood that the tonal selection controller may have more than two possible modes of operation (assignable characteristics) each of which use a defined threshold region and each of which providing an indicator to the remainder of the HFR coder on how to code the audio signal.

The tonal selection controller 303 passes to the multiplexer the characteristic or mode assigned to the current frame to provide an indication of which mode of operation has been selected in order that the indication may be also passed to the decoder.

As the number of modes will typically be low the number of bits required to code these modes of operation are similarly low.

The tonal detection mode selection is shown in FIG. 6 by step 609.

The following example describes where the tonal selection controller 303 indicates a tonal characteristic is defined for a current frame and where the operations of band replicant selection (step 611 of FIG. 6), band replicant scaling (step 613 of FIG. 6), and sinusoid injection and coding (step 615 of FIG. 6) are performed.

If the tonal selection controller 303 indicates that the audio signal is tonal then no band replicant selection or band replicant scaling operations are performed and only the sinusoid injection and coding operation is performed. The bit allocation reserved for replicant selection and replicant scaling operations may be used for the selection and coding of additional sinusoids.

If the tonal selection controller 303 indicates that the audio signal is normal then the band replicant selection and the band replicant scaling operations are performed. The performance of the normal mode may be further improved by sinusoid injection.

The HFR band replicant selector 305 receives the spectral components for each of the frequency sub-bands for the higher frequency region and the frequency domain representation of the lower frequency region coded signal and selects from the lower frequency region sections which match each of the higher frequency region sub-bands.

In some embodiments of the invention the sub-band energy is used to determine the closest matching lower frequency region sub-band.

In other embodiments of the invention different or additional properties of the higher frequency region sub-bands are determined and used to search for a matching lower frequency region part. Other properties include but are not limited to the peak-to-valley energy ratio of each sub-band and the signal bandwidth.

In some embodiments of the invention the analysis of the audio signal within the HFR band replicant selector 305 includes an analysis of the encoded low frequency region as well as the analysis of the original high frequency region. In further embodiments of the invention therefore the energy estimator determines properties of the effective whole of the spectrum by receiving the encoded low frequency signal and dividing these into short sub-bands to be analysed for example to determine the energy per 'whole' spectrum sub-band or/and the peak-to-valley energy ratio of each 'whole' spectrum sub-band.

In further embodiments of the invention the energy estimator further receives the encoded low frequency signal and (if required) divides these into short sub-bands to be analysed. The low frequency domain signal output from the encoder is then analysed in a similar way to the high frequency domain signal for example to determine the energy per low frequency domain sub-band or/and the peak-to-valley energy ratio of each low frequency domain sub-band.

The HFR band replicant selector 305 may in one embodiment of the invention perform a selection of low frequency spectral values which may be transposed to form acceptable replicas of high frequency spectral values. The number and the width of the bands to be used in a method such as described in detail in WO 2007/052088 may be fixed or may be determined in the HFR band replicant selector 305.

The selection of relevant LFR spectral values is shown in FIG. 6 by step 611.

The HFR band replicant scaler 307 furthermore receives the selected low frequency spectral values and determines if a scaling of these values may be made to decrease the differences between each high frequency region frequency sub-band and the selected low frequency spectral values.

The HFR band replicant scaler 307 in some embodiments of the invention may perform an encoding such as a quantization of the scaling factors to reduce the number of bits required to be sent to the decoder. The indication of the scaling factors used to get scaled selected LFR spectral values is passed to the multiplexer 311. Furthermore a copy of the scaled selected LFR spectral values are passed to the sinusoid injection selection/encoding device 309.

The replicant scaling is shown in FIG. 6 by step 613.

The concept of sinusoid injection and coding performed by the sinusoid injection and coder 309 is to improve the fidelity of the encoding of the HFR using the LFR signal components by adding sinusoids. The addition of at least one sinusoid may improve the accuracy of encoding.

For example, if $\hat{X}_H(k_i)$ and $X_H(k_i)$ represent the currently coded and original higher frequency region spectrums respectively, the sinusoid injection and coder 309 may add a first sinusoid at spectral index $k_1$ obtained from equation 3:

$$\max_{k_i} \left| X_H(k_i) - \hat{X}_H(k_i) \right| \quad (3)$$

In other words, the sinusoid may be inserted at the index with the largest difference between the original and coded high frequency region spectral values.

Furthermore the sinusoid injection and coder 309 may determine the amplitude of the inserted sinusoid according to equation 4:

$$A_i = X_H(k_i) - \hat{X}_H(k_i) \quad (4)$$

The sinusoid injection and coder 309 then produces an updated coded high frequency region spectrum using equation 5:

$$\text{new } \hat{X}_H(k_i) = \hat{X}_H(k_i) + A_i \quad (5)$$

The sinusoid injection and coder 309 may then repeat the operations of selection and scaling of the sinusoid and the operation of updating the coded higher frequency region to add further sinusoids until a desired number of sinusoids have been added. In a preferred embodiment of the invention the desired number of sinusoids is four.

In some embodiments of the invention the operations are repeated until the sinusoid injection and coder 309 detects that the overall error between the original and coded higher frequency region signal has been reduced below a coding error threshold.

The sinusoid injection and coder 309, having selected and scaled the sinusoids then performs the operation of coding the selected sinusoids in order an indication of the sinusoids may be passed to the decoder in an bit efficient manner.

The sinusoid injection and coder 309 may therefore quantise the amplitude $A_i$ of the selected sinusoids and submit the quantized amplitude values ($A_i$) to the multiplexer.

The sinusoid injection and coder 309 furthermore may encode the position and/or positions of the selected sinusoid or sinusoids.

In a first embodiment of the invention the position and sign of the selected sinusoid is quantized. However it has been found that the quantization of the position and sign is not optimal.

With respect to FIG. 8, the effect of the operation of coding the position and sign according to embodiments of the invention performed in the sinusoid injection and coder 309 are shown.

FIG. 8(*a*) shows an example of a spectrum of a typical high frequency region sub-band from 7000 Hz to 7800 Hz expressed by the MDCT coefficient values 801.

FIG. 8(*b*) shows and example where the possible positions which may have a selected sinusoid inserted are shown with respect to the index value. The 32 possible index positions may have zero, one or more sinusoids located on them.

FIG. 8(*c*) shows an embodiment of the invention whereby the 32 possible index positions are divided into at least two tracks. The tracks are interlaced so that with two tracks as shown in FIG. 8(*c*) each index of each track is located between two indices of the other track. In embodiments with more than two tracks each index is separated by an index from each of the other tracks. For example in FIG. 8(*c*) the 32 possible index positions are divided into track 1 803 and track 2 805.

Further embodiments may have more than 2 tracks which are interlaced. For example with three tracks interlaced the positions may be: $pos_1(n-1)$, $pos_2(n-1)$, $pos_3(n-1)$, $pos_1(n)$, $pos_2(n)$, $pos_s(n)$, $pos_1(n+1)$, $pos_2(n+1)$, $pos_3(n+1)$, where $pos_k(n)$ is the n:th position on k:th track.

Further embodiments may arrange the tracks into regions such that the tracks may be arranged with the positions $pos_1(1)$, $pos_1(2)$, . . . , $pos_1(N)$, $pos_2(1)$, $pos_2(2)$, . . . , $pos_2(N)$ for 2 tracks with a total of N positions each.

In further embodiments of the invention the tracks may be organised to cover not only a sub-band but the whole frequency region.

The sinusoid injection and coder 309 uses this separation of indices into tracks to improve the position encoding as can be explained with reference to the following example and with reference to FIG. 9.

Figure 9:
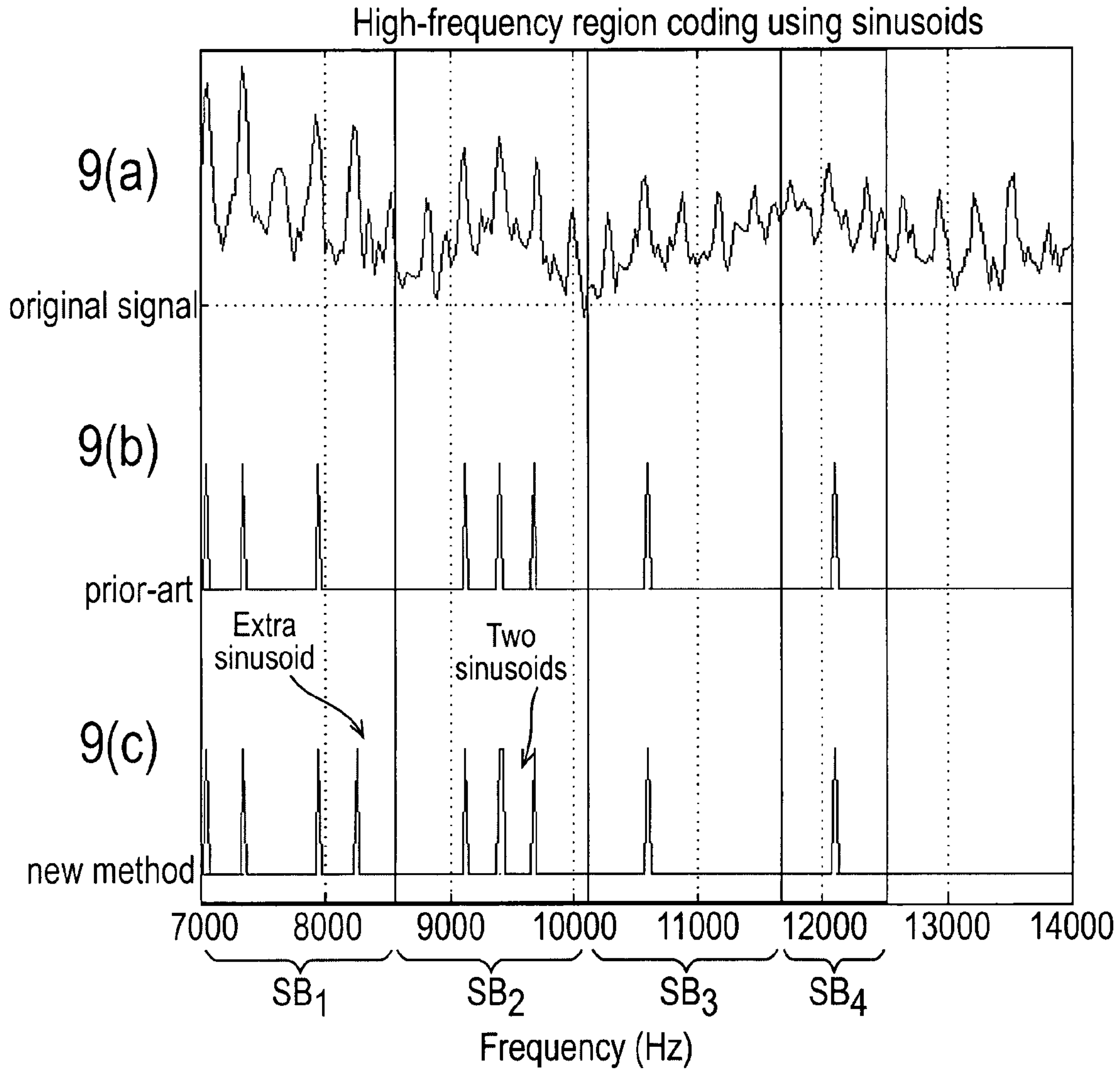
FIG. 9 shows further examples of a spectral representation of an audio signal and inserted sinusoidal positions according to embodiments of the invention.

FIG. 9(*a*) shows the spectrum for a higher frequency region signal from 7000 Hz to 14000 Hz. FIG. 9(*b*) shows the selected sinusoids in the single track index method where 8 sinusoids may be encoded before the bit encoding limit is reached. FIG. 9(*c*) shows the selected sinusoids in the two track index method according to the embodiment of the invention where 10 sinusoids may be encoded before the bit encoding limit is reached.

The HFR coding bit allocation is typically for embodiments of the invention 4 kbits/second (or 80 bits per frame) (of which about 20 to 25 bits per frame may be used for quantising the MDCT values or sinusoid amplitudes).

The bit allocation for each sub-band is described with respect to equation 6:

$$BR_{sub\text{-}band} = N_{sin}(B_{ind} + B_{sign}) \quad (6)$$

where $N_{sin}$, is the number of selected sinusoids and $B_{ind}$ and $B_{sign}$ are the required number of bits for location (indexing) and sign information respectively.

In the example shown in FIGS. 10(*b*) and 10(*c*), the four sub-band lengths are 64, 64, 64 and 32 positions respectively.

The sinusoid injection and coder 309 may according to the embodiment shown in FIG. 9(*b*) assign the following number of bits per sinusoid per sub-band: 6, 6, 6, and 5 respectively. This number of bits uniquely defines each index and thus determines each sinusoid in the sub-band respectively. The sinusoid injection and coder 309 may then assign an extra bit to define the sign of the sinusoid, in other words whether the sinusoid is in phase or 180 degrees out of phase. The bit rate for the frame is therefore given by equation 7:

$$BR_{total,method\ 1} = N_{sb,1}(6+1) + N_{sb,2}(6+1) + N_{sb,3}(6+1) + N_{sb,4}(5+1) \quad (7)$$

where $N_{sb,I}$ is the number of sinusoids in the i'th sub-band. As can be seen in FIG. 9(*b*) $N_{sb,1}=3$, $N_{sb,2}=3$, $N_{sb,3}=1$, $N_{sb,4}=1$, thus the bits required to encode for 8 sinusoids is 55 bits/frame.

The sinusoid injection and coder 309 in the improved encoding method using 2 tracks per sub-band reduces the number of bits used per sinusoid per sub-band due to fewer possible individual positions for each sinusoid in a sub-band and due to redundancy in ordering of individual sinusoids on each track.

The sinusoids are chosen within each sub-band and track and coded in a known order so that the decoder can identify the correct position index.

The bit saving is based on the fact that the order of selecting and transmitting sinusoids on a track is irrelevant. It does not matter whether we have sinusoid positions P and R (and in embodiments of the invention the signs may be designated as being opposite) or R and P (where in embodiments of the invention the signs may be designated as the same) on a single track.

The sinusoid injection and coder 309 in the improved encoding method using 2 tracks per sub-band reduces the number of bits used per sinusoid per sub-band due to fewer possible individual positions for each sinusoid in a sub-band and due to redundancy in ordering of individual sinusoids on each track.

As can be seen from FIG. 9(*c*) it is possible to encode for the first two sub-bands 2 sinusoids both on the first and the second track. Sub-bands 3 and 4 have the same number of sinusoids as shown in the first method. The bit rate for each track (with 2 sinusoids each) in sub-bands 1 and 2 is (5+1)+(5+0). For sub-band 3 the bit requirement is (6+1) and for sub-band 4 it is (5+1). The total bit rate required for the 10 sinusoids is thus 57 bits per frame.

Thus the sinusoid injection and coder 309 may in the improved method add two additional sinusoids for the cost of only two bits per frame.

The bit rate per sinusoid for the first and second methods are 6.875 bits and 5.7 bits respectively for this example.

The sinusoid injection and coder 309 may select the number of tracks to be used within a sub-band dependent on the sub-band length. If the sub-band size is adaptive (i.e., can change from frame to frame), the lengths selected should provide the method with performance improvements.

For example a sub-band length of 32 may be easily divided into 2 tracks of 16. Similarly, a length of 48 may be divided into 3 tracks of 16. Lengths of 64 may be divided into either 2 tracks of 32 or 4 tracks of 16. The selection may be determined on the available bit rate.

The sinusoid injection and coder 309 may select a structure of the track which permits the insertion of successive sinusoids and preferably more than one sinusoid can be placed on each track.

Thus for example in embodiments of the invention where two sinusoids are to be selected one from each track, the arrangement of the tracks may be chosen so that possible sinusoid positions P and P+1 (which are perceptually important) are in different tracks so that both may be selected.

The frequency sub-band length, where it is variable, should be selected such that the overall energy of the coded higher frequency region will not significantly fluctuate from frame to frame.

The coding of the position of the inserted sinusoids in terms of track indices thus improves the coding rate required for indicating any injected sinusoids as can be seen above.

In further embodiments of the invention the sinusoid injection and coder 309 may further improve on the coding of the positions of the injected sinusoids.

In some embodiments of the invention the sinusoid injection and coder 309 after determining the positions and amplitudes of the most perceptually important sinusoids analyses the relative difference in position between a subset of the sinusoids. These relative positions are then used to determine if the arrangement of the sinusoids may be encoded using only a few bits. If there is no pattern in the arrangement of sinusoids detected one of the previously described methods for encoding the position of the sinusoids may be used to code the position of the selected sinusoids.

As has been described previously, the coded higher frequency region may be divided into a series of frequency sub-bands. Each frequency sub-band may then be searched to determine positions within each frequency sub-band where selected sinusoids may be inserted. These selected sinusoids may improve the accuracy of the coded higher frequency region when compared against the original higher frequency region signal.

In a first embodiment of the invention the number of frequency sub-bands the spectrum may be divided into is 6. In other embodiments of the invention the number of sub-bands may be variable as described previously.

The sinusoid injection and coder 309 for each of the sub-bands compares the selected sinusoids and their positions within each sub-band to determine which may be considered to be a starting point for a structure. For example in one embodiment of the invention the sinusoid injection and coder 309 selects as a starting point sinusoid the selected sinusoid with the lowest frequency. In other embodiments of the invention the starting point sinusoid selected is the median sinusoid, or the higher frequency sinusoid in the sub-band.

Once a starting point sinusoid is selected the difference between the starting point position and other selected sinusoid positions in the sub-band are examined. Any relationship between the starting point position and the remainder of the selected sinusoids in the sub-band may then be coded.

For example if the first sinusoid is located at index 5 within the sub-band, and two further sinusoids are located at index positions 12 and 19 the sinusoid injection and coder 309 may then code the sinusoids position as absolute index 5 and then relative index 7 and further relative index 7. In other embodiments of the invention the sinusoid injection and coder 309 codes the absolute index (5), a relative index (7) and the total number of sinusoids in the structure (3).

Furthermore the example provided above would be more efficient as the number of selected sinusoids per frequency sub-band increases. This for the absolute, relative, relative coding embodiment shown above would be because the average distance between sinusoids would reduce as more sinusoids are added and therefore the number of bits on average required to code the relative distance between the sinusoids would therefore decrease thus reducing the required number of indication bits per sinusoid.

Similarly for the absolute, relative, total coding embodiment the average number of bits per sinusoid is decreased as the number of selected sinusoids increases as each extra sinusoid only requires the total count to be increased.

Although the sinusoid injection and coder 309 would be required to search the selected sinusoids to determine the relative difference as the total number of sinusoids are limited this increase in complexity is not onerous.

In further embodiments of the invention the sinusoid injection and coder 309 uses the starting point sinusoid and searches the sinusoids relative to the starting point within the sub-band to determine a sinusoid structure which matches or closely matches a predefined candidate structures.

According to embodiments of the invention the criteria used to determine the sinusoid structure may be selectable or variable. For example the sinusoid injection and coder 309 in one embodiment may simply select the candidate structure which has the largest number of matching sinusoids, or the importance of the candidate sinusoid matching (for example if one structure has 'matched' N sinusoids while another has 'matched' N−1, the N−1 candidate may be selected as the candidate structure more accurately matches the selected sinusoids which are perceptually important).

In addition, the sinusoid injection and coder 309 may include the sign information for each of the sinusoids and encode the sinusoid amplitudes as described above (for example using vector quantization to reduce the number of bits used to represent the amplitudes).

In some embodiments of the invention, the sinusoid injection and coder 309 may, where the structures have the same number of 'matched' sinusoids, select the match that has more 'matched' sinusoids in the lower frequencies of the high frequency region.

In further embodiments of the invention, the sinusoid injection and coder 309, after selecting the candidates for the starting point sinusoid and the relative index, uses this predefined sinusoid location template from which any deviation from the template sinusoid location/indices are detected. The detected deviations may in one embodiment of the invention be coded by searching a predefined look-up table of deviations, also known as a small position deviation codebook, and then outputting the code associated from the deviation.

Although the sinusoid injection and coder 309 in this embodiment has greater flexibility in terms of the location of potential sinusoids, the searching for deviations increases the search processing required.

Whilst this embodiment produces results which may more accurately indicate the actual positions of the optimal sinusoids the bit rate associated with each sinusoid is also increased. Thus, this further embodiment is not necessarily the most efficient to be used at lower bit rates. Furthermore this embodiment may use even more processor resources as the structure and errors have to be searched or coded for.

In further embodiments associated with the previously described embodiments the sinusoid injection and coder 309 may tolerate a small degree of error between the sinusoid structure or deviation and the coded for sinusoid structure or deviation. In other words to speed up the search and coding of both structure and deviation positions a limited sub-set of structures and/or deviations from the structures are searched over. This embodiment may be acceptable where speed of encoding and bit-rate per sinusoid are to be optimised and the error in the structure and/or deviation of the sinusoid is acceptable or can be tolerated.

However such embodiments need to take into account that prolonged shifting or fluctuation of sinusoid positions from frame to frame can make the error perceptible.

Although the above examples have been described as being carried out per frequency sub-band, they may also be applied across the whole of the higher frequency region signal at the same time. Thus relational coding, structural coding, and small deviation coding on a fixed or variable structure may be performed with the sub-band being the whole higher frequency region signal.

The sinusoid indication information may then be passed to the multiplexer 311 to be included in the bitstream output.

The operation of selection and coding of the sinusoids is shown in FIG. 6 by step 615.

The bitstream formatter 234 receives the low frequency coder 231 output, the high frequency region processor 232 output and formats the bitstream to produce the bitstream output. The bitstream formatter 234 in some embodiments of the invention may interleave the received inputs and may generate error detecting and error correcting codes to be inserted into the bitstream output 112.

The step of multiplexing the HFR coder 232 and LFR coder 231 information into the output bitstream is shown in FIG. 6 by step 617.

Figure 5:
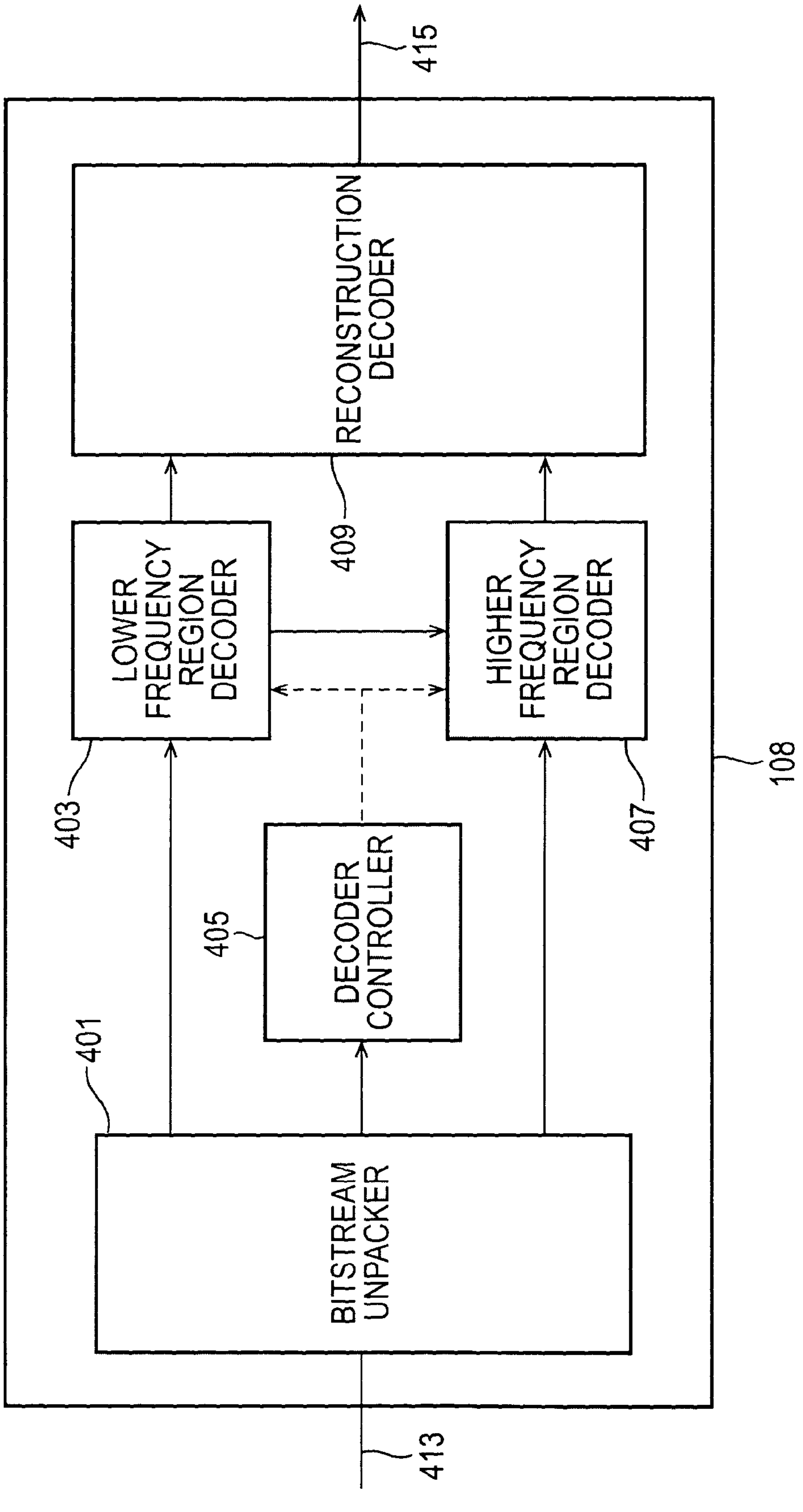
FIG. 5 shows schematically a decoder part of the audio codec system.

To further assist the understanding of the invention the operation of the decoder 108 with respect to the embodiments of the invention is shown with respect to the decoder schematically shown in FIG. 5 and the flow chart showing the operation of the decoder in FIG. 7.

The decoder comprises an input 413 from which the encoded bitstream 112 may be received. The input 413 is connected to the bitstream unpacker 401.

The bitstream unpacker demultiplexes, partitions, or unpacks the encoded bitstream 112 into three separate bitstreams. The low frequency encoded bitstream is passed to the lower frequency region decoder 403, the spectral band replication bitstream is passed to the high frequency reconstructor 407 (also known as a high frequency region decoder) and control data passed to the decoder controller 405.

This unpacking process is shown in FIG. 7 by step 701.

The lower frequency region decoder 403 receives the low frequency encoded data and constructs a synthesized low frequency signal by performing the inverse process to that performed in the lower frequency region coder 231. This synthesized low frequency signal is passed to the higher frequency region decoder 407 and the reconstruction decoder 409.

This lower frequency region decoding process is shown in FIG. 7 by step 707.

The decoder controller 405 receives control information from the bitstream unpacker 401. With respect to the present invention the decoder controller 405 receives information with regards to whether in the HFR coding process spectral replication was employed as described previously with respect to the HFR band replicant selection processor 305 and the HFR band replicant scaling processor 307. Any specific information required to configure the HFR decoder in reconstructing the HFR region using this method is then passed to the HFR decoder and the method includes the step 705 as described below.

Furthermore the decoder controller 405 receives control information from the bitstream unpacker 401 with respect to any sinusoid selection and injection processes selected in the HFR coder and the HFR sinusoid injection and coder 309.

The setting up of the HFR decoder is shown in FIG. 7 by step 703.

In some embodiments of the invention the decoder controller 405 may be part of the high frequency decoder 407.

The HFR decoder 407 may carry out a replicant HFR reconstruction operation, for example by replicating and scaling the low frequency components from the synthesized low frequency signal as indicated by the high frequency reconstruction bitstream in terms of the bands indicated by the band selection information. This operation is carried out dependent on the information provided by the decoder controller 405.

This high frequency replica construction or high frequency reconstruction is shown in FIG. 8 by step 705.

The HFR decoder 407 may also carry out a sinusoid selection and injection operation to improve the accuracy of the HFR reconstruction operation dependent on the information provided by the decoder controller 405. Thus according to the embodiment of the invention the decoder controller 405 may control the HFR decoder 407 not to add any sinusoids, to add the sinusoids according to bitstream format indicated by the decoder controller 405. Thus non limited examples include inserting sinusoids according to the provided index and track information, the structure of the sinusoid arrangement, the relative spacing of the sinusoid arrangement, and the deviation from a fixed or variable arrangement or structure of sinusoids.

The injection of sinusoid operation is shown in FIG. 7 by step 709.

The reconstructed high frequency component bitstream is passed to the reconstruction decoder 409.

The reconstruction decoder 409 receives the decoded low frequency bitstream and the reconstructed high frequency bitstream to form a bitstream representing the original signal and outputs the output audio signal 114 on the decoder output 415.

This reconstruction of the signal is shown in FIG. 8 by step 711.

The embodiments of the invention described above describe the codec in terms of separate encoders 104 and decoders 108 apparatus in order to assist the understanding of the processes involved. However, it would be appreciated that the apparatus, structures and operations may be implemented as a single encoder-decoder apparatus/structure/operation. Furthermore in some embodiments of the invention the coder and decoder may share some/or all common elements.

Although the above examples describe embodiments of the invention operating within a codec within an electronic device 10, it would be appreciated that the invention as described below may be implemented as part of any variable rate/adaptive rate audio (or speech) codec. Thus, for example, embodiments of the invention may be implemented in an audio codec which may implement audio coding over fixed or wired communication paths.

Thus user equipment may comprise an audio codec such as those described in embodiments of the invention above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may rep-resent program steps, or interconnected logic circuits, blocks and functions, or a combination of program steps and logic circuits, blocks and functions.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising:

at least one processor and at least one non-transitory memory including computer program code, wherein the at least one non-transitory memory and the computer program code are configured to, with the at least one processor, cause the apparatus at least to:
  separate an audio signal into a lower frequency region and a higher frequency region;
  encode the lower frequency region of the audio signal and encode the higher frequency region of the audio signal by adding repeatedly single sinusoids to the higher frequency region until a desired number of sinusoids have been added, wherein an index of the single sinusoids within the higher frequency region are selected based on the absolute difference between spectral values of the higher frequency region and spectral values of a synthesized higher frequency region;

select at least two of said single sinusoids;

determine the frequency separation between the two single sinusoids;

search a list of frequency separation values for the determined frequency separation between the two single sinusoids; and select one of the list which more closely matches the determined frequency separation between the two single sinusoids, generate an indicator, the indicator being configured to represent the at least two single sinusoids wherein the indicator is dependent on selected one of the list of frequency separation values.

2. The apparatus as claimed in claim 1, wherein the at least one memory and the computer program code are further configured to, with the at least one processor, cause the apparatus at least to:

select at least one further single sinusoid; wherein the indicator is further configured to represent the at least one further single sinusoid and wherein the indicator is further configured to be dependent on the frequency separation between the at least one further single sinusoid and one of the at least two single sinusoids.

3. The apparatus as claimed in claim 1, wherein the indicator is further configured to be dependent on the frequency of one of the at least two single sinusoids.

4. The apparatus as claimed in claim 1, wherein the at least one memory and the computer program code are further configured to with the at least one processor, cause the apparatus at least to:

determine a difference between the selected one of the list of frequency separation values and the determined frequency separation value; wherein the indicator is further dependent on the difference.

5. The apparatus as claimed in claim 4, wherein the at least one memory and the computer program code are further configured to with the at least one processor, cause the apparatus at least to:

search a further list of difference values for the determined difference between the selected one of the list of frequency separation values and the determined frequency separation value; and select one of the further list of difference values which more closely matches the determined difference value, wherein the indicator is dependent on selected one of the further list of difference values.

6. A method comprising:

separating an audio signal into a lower frequency region and a higher frequency region;

encoding the lower frequency region of the audio signal and encode the higher frequency region of the audio signal by adding repeatedly single sinusoids to the higher frequency region until a desired number of sinusoids have been added, wherein the index of the single sinusoids within the higher frequency region are selected based on the absolute difference between spectral values of the higher frequency region and spectral values of a synthesized higher frequency region; selecting at least two of said single sinusoids;

determining the frequency separation between the two single sinusoids;

searching a list of frequency separation values for the determined frequency separation between the two single sinusoids; and selecting one of the list which more closely matches the determined frequency separation between the two single sinusoids, generating an indicator, the indicator being configured to represent the at least two sinusoids, wherein the indicator is dependent on selected one of the list of frequency separation values.

7. The method as claimed in claim 6, further comprising selecting at least one further single sinusoid; wherein the indicator is further configured to represent the at least one further single sinusoid and wherein the indicator is further configured to be dependent on the frequency separation between the at least one further single sinusoid and one of the at least two single sinusoids.

8. The method as claimed in claim 6, wherein the indicator is further dependent on the frequency of one of the at least two single sinusoids.

9. The method as claimed in claim 6, further comprising determining a difference between the selected one of the list of frequency separation values and the determined frequency separation value; wherein the indicator is further dependent on the difference.

10. The method as claimed in claim 9, further comprising:

searching a further list of difference values for the determined difference between the selected one of the list of frequency separation values and the determined frequency separation value; and selecting one of the further list of difference values which more closely matches the determined difference value, wherein the indicator is dependent on selected one of the further list of difference values.

11. A computer program product comprising a non-transitory computer readable medium bearing computer program code embodied therein for use with a computer, the computer program code comprising:

code for separating an audio signal into a lower frequency region and a higher frequency region;

code for encoding the lower frequency region of the audio signal and encode the higher frequency region of the audio signal by adding repeatedly single sinusoids to the higher frequency region until a desired number of sinusoids have been added, wherein the index of the single sinusoids within the higher frequency region are selected based on the absolute difference between spectral values of the higher frequency region and spectral values of a synthesized higher frequency region;

code for selecting at least two of said single sinusoids;

code for determining the frequency separation between the two single sinusoids;

code for searching a list of frequency separation values for the determined frequency separation between the two single sinusoids; and code for selecting one of the list which more closely matches the determined frequency separation between the two single sinusoids, code for generating an indicator, the indicator being configured to represent the at least two sinusoids, wherein the indicator is dependent on selected one of the list of frequency separation values.

* * * * *